United States Patent [19]

Wakita

[11] Patent Number: 4,885,498
[45] Date of Patent: Dec. 5, 1989

[54] STACKED TYPE PIEZOELECTRIC ACTUATOR

[75] Inventor: Naomasa Wakita, Aichi, Japan

[73] Assignee: NGK Spark Plug Co., Ltd., Aichi, Japan

[21] Appl. No.: 875,769

[22] Filed: Jun. 18, 1986

[30] Foreign Application Priority Data

Jun. 19, 1985 [JP] Japan .............................. 60-93187[U]
Aug. 29, 1985 [JP] Japan ............................ 60-132219[U]

[51] Int. Cl.$^4$ ............................................ H01L 41/08
[52] U.S. Cl. .................................... 310/328; 310/359; 310/366; 310/346
[58] Field of Search ............................... 310/357-359, 310/365, 366, 328, 346

[56] References Cited

U.S. PATENT DOCUMENTS

| | | | |
|---|---|---|---|
| 2,998,535 | 8/1961 | Church et al. | 310/346 X |
| 3,349,259 | 10/1967 | Kistler | 310/346 X |
| 3,390,287 | 6/1968 | Sonderegger | 310/346 X |
| 3,441,754 | 4/1969 | Heny | 310/346 |
| 3,569,749 | 3/1971 | Zeiringer | 310/346 X |
| 3,673,442 | 6/1972 | Sonderegger | 310/346 X |
| 4,471,256 | 9/1984 | Igashira et al. | 310/365 X |
| 4,570,098 | 2/1986 | Tomita et al. | 310/346 |

Primary Examiner—Mark O. Budd
Attorney, Agent, or Firm—Finnegan, Henderson, Farabow, Garrett and Dunner

[57] ABSTRACT

A stacked type piezoelectric actuator comprises a main stack of a plurality of electrostrictive strain elements stacked one on another. Each strain element comprises a first piezoelectric element plate having a first direction of polarization and a second piezoelectric element plate having a second direction of polarization. An end electrostrictive strain element is mounted on an end of the stack and has a lower shear strain component during widthwise expansion and contraction of the actuator. The end element includes either a stack of two or more of the first piezoelectric element plates or a pair of first and second piezoelectric element plates when the first piezoelectric element plate has a piezoelectric strain constant $d_{33}$ that is less than the strain constant $d_{33}$ of the first and second piezoelectric element plates in the main stack.

6 Claims, 3 Drawing Sheets

4,885,498

STACKED TYPE PIEZOELECTRIC ACTUATOR

FIELD OF THE INVENTION

The present invention relates to a stacked type piezoelectric actuator in which a number of electrostrictive strain elements constituted by piezoelectric element plates are electrically connected in parallel and stacked one on another.

BACKGROUND OF THE INVENTION

It has been known that expansion and contraction strain is generated in the direction of the thickness of a piezoelectric element plate made of a material such as lead zirconate titanate (PZT) upon the application of a voltage across electrodes provided on the upper and lower surfaces of the piezoelectric element plate. A stacked type piezoelectric actuator is arranged such that piezoelectric element plates of this type are stacked one on another and connected electrically in parallel to each other to superimpose the quantities of the expansion and contraction strain and to make it possible to derive the displacement in the direction of the stack from an end portion of the stacked type piezoelectric actuator.

As shown in FIG. 1, such a generally used stacked type piezoelectric actuator 1 above is arranged such that a plurality of electrostrictive strain elements each constituted by a single piezoelectric element plate 2 are stacked one on another.

In the piezoelectric element plate 2, strain is caused widthwise as expansion and contraction strain is generated in the direction of thickness. That is, the piezoelectric element plate 2 is contracted in width as the thickness of the piezoelectric element plate 2 expands. Similarly, the piezoelectric element plate 2 is expanded in width as the thickness of the piezoelectric element plate 2 contracts. Thus, a displacement deriving end of the stacked type piezoelectric actuator 1 comes in contact with a no-strain portion 3 including a metal block, a displacement deriving portion, and the like, in which very little strain is generated. Therefore, shearing stress is generated in the contact surface of the piezoelectric element plate 2 as strain is generated widthwise so that the electrode formed on the contact surface of the piezoelectric element plate 2 peels or is worn by the stress.

A stacked type piezoelectric actuator 1 arranged in the manner shown in FIG. 2 has been proposed in Japanese Unexamined Patent Publication No. 86880/85. Strain in the direction of expansion and contraction is proportional to a voltage applied to the electrostrictive strain element. On the other hand, strain in the shearing direction is generated to cancel a change in volume of the stacked type piezoelectric actuator 1 in the upward and downward direction generated as the expansion and contraction strain is generated so as to make the volume of the stacked type piezoelectric actuator 1 constant.

The larger the thickness of the electrostrictive strain element is made, the smaller will be the displacement in the shearing direction. Thus, there has been proposed a stacked type piezoelectric actuator wherein a piezoelectric element plate 2a disposed at a displacement deriving end of the stacked type piezoelectric actuator 1 so as to come in contact with the no-strain portion 3 is made different from the other piezoelectric element plates 2 in that the thickness of the former is larger than the latter so as to reduce the quantity of widthwise strain in the piezoelectric element plate 2a and thereby reduce the shear stress in the piezoelectric element plate 2a.

The arrangement of FIG. 2, however, has a disadvantage in that the number of steps in manufacturing is increased and yield is reduced because it is necessary to provide the piezoelectric element plate 2a at the displacement deriving end separately from the other piezoelectric element plates 2.

OBJECTS AND SUMMARY OF THE INVENTION

An object of the present invention is an improved stacked type piezoelectric actuator.

Another object of the present invention is to reduce the shear strain between electrode and piezoelectric element of the measuring end portion of a stacked type piezoelectric actuator.

A further object of the present invention is a stacked type piezoelectric actuator that is simple and inexpensive to manufacture.

These and other objects are attained by a stacked type piezoelectric actuator comprising a plurality of electrostrictive strain elements stacked on one another, each of the electrostrictive strain elements including a first piezoelectric element plate having a first direction of polarization and a second piezoelectric element plate having a second direction of polarization opposite to the first direction of polarization, an end electrostrictive strain element mounted on one end of the stack of electrostrictive strain elements, the end electrostrictive strain element comprising to of the first piezoelectric element plates mounted one on top of the other, and a first electrode mounted on the top surface of the top piezoelectric element path of the end electrostrictive strain element and a second electrode mounted on the bottom surface of the bottom piezoelectric element plate of the end electrostrictive strain element.

The present invention further contemplates a stacked type piezoelectric actuator comprising a plurality of electrostrictive strain elements stacked one on another, each of the electrostrictive strain elements including a first piezoelectric element plate having a first direction of polarization and a second piezoelectric element plate having a second direction of polarization opposite to the first direction of polarization, and an end electrostrictive strain element mounted on one end of the stack of electrostrictive strain elements, the end electrostrictive strain element comprising a third piezoelectric element plate mounted on top of a second piezoelectric element plate, the third piezoelectric element plate having the first direction of polarization and a piezoelectric strain constant $d_{33}$ smaller than the piezoelectric strain constant $d_{33}$ of the first and second piezoelectric element plates.

BRIEF DESCRIPTION OF THE DRAWINGS

The manner by which the above object and other objects, features, and advantages of the present invention are attained will become fully apparent from the following detailed description when it is considered in view of the drawings, wherein.

DETAILED DESCRIPTION OF THE INVENTION

Figure 1:
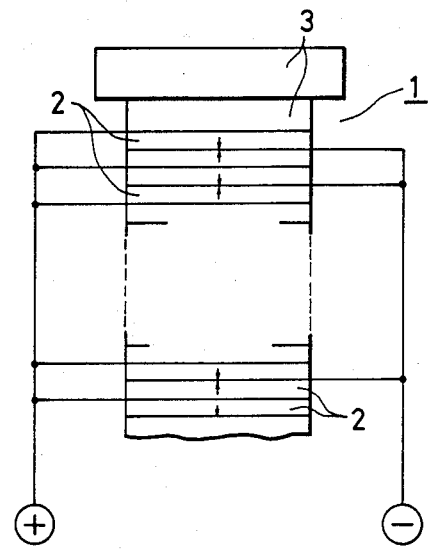
FIG. 1 is a side view of a conventional stacked type piezoelectric actuator.
Figure 2:
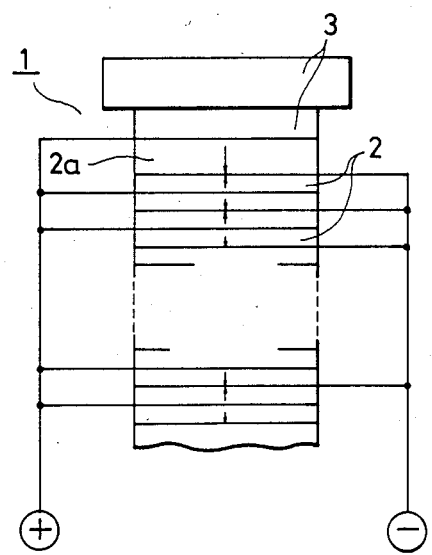
FIG. 2 is a view of another type of conventional stacked type piezoelectric actuator.

According to an aspect of the present invention, a stacked type piezoelectric actuator includes a plurality of electrostrictive strain elements constituted by piezoelectric element plates electrically connected in parallel and stacked one on another. One of the electrostrictive strain elements arranged at an end portion of the stacked type piezoelectric actuator is constituted by at least two piezoelectric element plates having the same shape as the other piezoelectric element plates and the same direction of polarization with each other.

According to another aspect of the present invention, a stacked type piezoelectric actuator in which a number of piezoelectric element plates are electrically connected in parallel and stacked one on another, is characterized in that one of the piezoelectric element plates arranged at an end portion of the stacked type piezoelectric actuator is selected to have a piezoelectric strain constant $d_{33}$ smaller than the other piezoelectric element plates.

The reduction in piezoelectric strain constant $d_{33}$ can be realized by lowering the polarizing condition, for example, by decreasing the polarizing voltage, or by adjusting the contents of material constituting the piezoelectric element plate.

A set of at least two piezoelectric element plates are arranged at a displacement deriving end portion of the stacked type piezoelectric actuator so that when a voltage is applied to the electrodes formed on the uppermost and lowermost surfaces of the set, strain is generated in the direction of the thickness of the integrated set of piezoelectric element plates. Thus, one electrostrictive strain element is constituted by the number of piezoelectric element plates in the set. The electrostrictive strain element thus formed has a thickness corresponding to the number of the piezoelectric element plates in the set, that is, the thickness is an integer multiple of the thickness of each of the other electrostrictive strain elements each of which is constituted by one piezoelectric element plate. Therefore, strain in the shearing direction is reduced by 1/n where N is the number of plates in the set as described above, strain is inversely proportional to thickness. As a result, the shear stress between a stationary surface of a metal block or the like and the upper surface of the actuator is made small to reduce the wear of the electrode formed on the upper surface.

Further, in another embodiment, the piezoelectric strain constant $d_{33}$ of a piezoelectric element plate arranged at the displacement deriving end portion of the stacked type piezoelectric actuator is selected to be smaller than the other piezoelectric element plates, so that strain generated in the direction of the thickness of the displacement deriving end piezoelectric element plate corresponding to an applied given voltage is smaller than that in the other piezoelectric element plates. Therefore, strain in the shear direction in the displacement deriving end piezoelectric element plate is smaller than in the other piezoelectric element plates.

Figure 3:
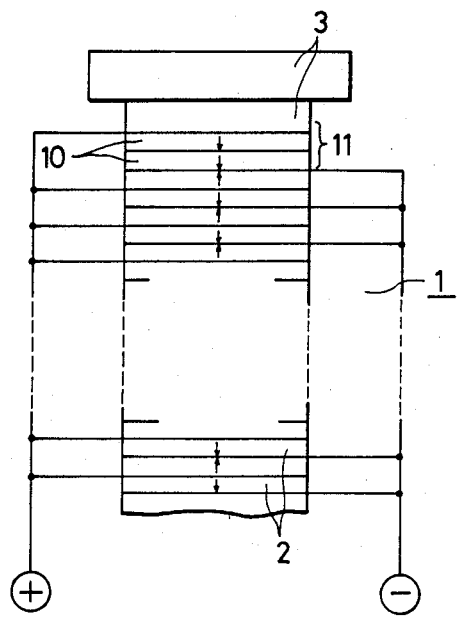
FIG. 3 is a side view of an embodiment of a stacked type piezoelectric actuator according to the present invention.

FIG. 3 shows a first embodiment of the stacked type piezoelectric actuator according to the present invention. In this embodiment, a large number of piezoelectric element plates 2 are stacked one on another in such a manner that the direction of polarization of the piezoelectric element plates 2 varies alternately so that each of the piezoelectric element plates 2 constitutes an individual electrostrictive strain element independent from each other. The individual electrostrictive strain element 00 provided with electrodes at its upper and lower surfaces.

A further electrostrictive strain element 11 is provided at a displacement deriving end portion.

The electrostrictive strain element 11 is constituted by two piezoelectric element plates 10 stacked one on the other in such a manner that the direction of polarization of the respective piezoelectric element plates 10 is the same for each plate. The piezoelectric element plates 10 are formed through the same manufacturing process as the piezoelectric element plates 2 and each has a thickness equal to the piezoelectric element plates 2.

As shown in FIG. 3, the electrostrictive strain elements are each constituted by an individual piezoelectric element plate 2. The element plates 2 comprising the electrostrictive strain elements are stacked in such a manner that the direction of polarization of the electrostrictive strain elements varies alternately one by one so as to make the abutting or adjacent surfaces of the electrostrictive strain elements have the same polarity with each other and make it possible to stack the electrostrictive strain elements without interposing any insulating plate therebetween. The electrostrictive strain elements are electrically connected in parallel to each other as shown in the drawing.

A no-strain portion 3 constituted by a metal block or the like is provided on the electrode formed on the upper surface of the uppermost piezoelectric element plate 10 of the electrostrictive strain element 11 arranged at the displacement deriving end portion of the actuator 1.

In the arrangement as shown in FIG. 3, when a voltage is applied to each of the piezoelectric element plates 2 and the electrostrictive strain element 11, the respective piezoelectric element plates 2 and the electrostrictive strain element 11 are expanded and contracted to generate strain widthwise in the reverse direction. Friction in the shearing direction is generated between the electrode formed on the upper surface of the uppermost piezoelectric element plate 10 and the lower surface of the no-strain portion 3. The thickness of the electrostrictive strain element 11, however, is twice as large as the thickness of a single piezoelectric element plate 2, so that the widthwise strain in electrostrictive strain element 11 is ½ of that of the respective piezoelectric element plates 2. The shearing stress received on the upper surface of the uppermost piezoelectric element plate 10 is reduced correspondingly.

Figure 4:
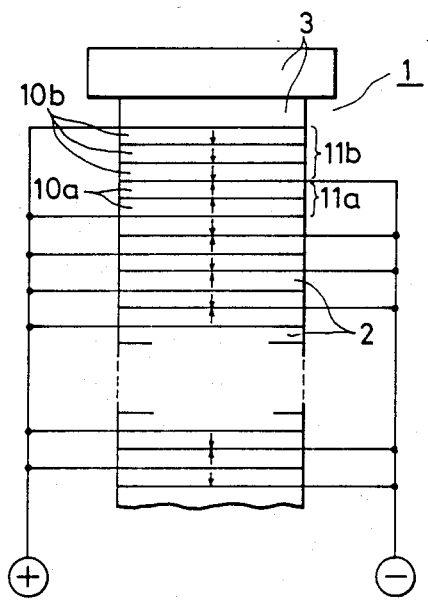
FIG. 4 is a side view of a second embodiment of a stacked type piezoelectric actuator according to the present invention.

FIG. 4 shows a second embodiment of the present invention. In this embodiment, piezoelectric element plates 2 are stacked one on another in such a manner that the direction of polarization of the piezoelectric element plates 2 varies alternately. A first electrostrictive strain element 11a is provided at an end portion of the stack, the first electrostrictive strain element 11a includes two piezoelectric element plates 10a stacked one on the other in such a manner that the direction of polarization of the two piezoelectric element plates 10a is the same. The piezoelectric element plates 10a are formed through the same manufacturing process as described for the piezoelectric element plates 2 and each of the plates 10a are a thickness equal to that of a single piezoelectric element plate 2.

A second electrostrictive strain element 11b is further provided on the first electrostrictive strain element 11a. The second electrostrictive strain element 11b includes three piezoelectric element plates 10b stacked one on another such that the direction of polarization of the respective piezoelectric element plates 10b is the same for each element 11b.

The direction of polarization of the first and second electrostrictive strain elements 11a and 11b are different from each other. The piezoelectric element plates 2, and the first and second electrostrictive strain elements 11a and 11b are connected electrically in parallel to each other in the same manner as in the foregoing embodiment.

In this arrangement, the widthwise strain in the first electrostrictive strain element 11a is ½ of that of the respective piezoelectric element plate 2, and the widthwise strain in the second electrostrictive strain element 11b is ⅓ of that of the respective piezoelectric element plate 2. Therefore, the widthwise strain is gradually decreased toward the displacement deriving end of the actuator 1.

If the first electrostrictive strain element 11a is omitted and only the second electrostrictive strain element 11b is arranged on the upper portion of the actuator 1, shearing stress between the uppermost end surface of the second electrostrictive strain element 11b and a lower surface of a no-strain portion 3 is reduced to ⅓ of the conventional level, however, a difference in strain between the lower surface of the second electrostrictive strain element 11b and the upper surface of the piezoelectric element plate 2 directly under the second electrostrictive strain element 11b becomes large and an electrode provided on the upper surface of the above-mentioned piezoelectric element plate 2 will cause the surface to wear. Therefore, the first electrostrictive strain element 11a is interposed between the second electrostrictive strain element 11b and the piezoelectric element plate 2 to gradually reduce the shearing stress between the no-strain portion 3 and the piezoelectric element plates 2.

Although provided at the upper portion of the actuator 1 in the first and second embodiments, the electrostrictive strain element 11, and electrostrictive strain elements 11a and 11b may be provided also at the lower portion of the actuator 1 so as to reduce widthwise strain between an upper surface of a base portion acting as the no-strain portion 3 and a lower surface of the lowermost piezoelectric element plates 10.

Figure 5:
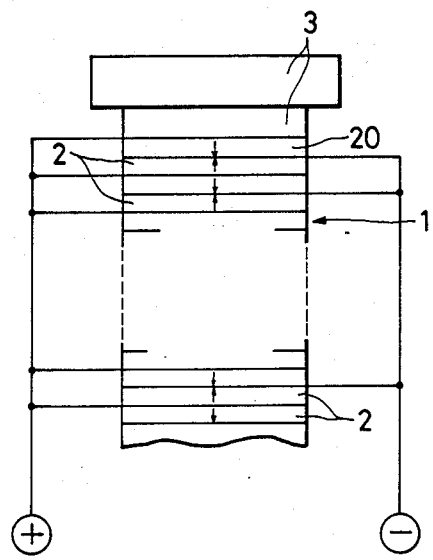
FIG. 5 is a side view of a third embodiment of a stacked type piezoelectric actuator according to the present invention.

FIG. 5 shows a third embodiment according to the present invention. In this embodiment, a large number of piezoelectric element plates 2 having electrodes disposed on the opposite surfaces thereof are stacked one on another, and a piezoelectric element plate 20 is provided at a displacement deriving end portion. The piezoelectric element plate 20 is formed through the same manufacturing process as the piezoelectric element plates 2 and has a thickness equal to the thickness of the piezoelectric element plate 2. The piezoelectric element plate 20, however, is made of a material having a piezoelectric strain constant $d_{33}$ which is smaller than the respective piezoelectric element plate 2. As shown in FIG. 5, the piezoelectric element plates 2 and 20 are stacked in a manner so that the direction of polarization of the piezoelectric element plates varies alternately to make the abutting or adjacent surfaces of the piezoelectric element plates have the same polarity and to make it possible to stack the piezoelectric plates without interposing any insulating plate therebetween. The piezoelectric element plates are electrically connected in parallel to each other as shown in the drawing.

A no-strain portion 3 includes a metal block or the like and is provided on an electrode formed on the upper surface of the uppermost piezoelectric element plate 20 arranged at the displacement deriving end portion of the actuator 1.

In such an arrangement as described above, when a voltage is applied to each of the piezoelectric element plates 2 and the plate 20, the piezoelectric element plates 2 and 20 expand and contract so that widthwise strain is generated in the reverse direction. Therefore, friction in the shearing direction is generated between the electrode formed on the upper surface of the uppermost piezoelectric element plate 20 and the lower surface of the no-strain portion 3. The thicknesswise strain in the piezoelectric element plate 20 is smaller than that in the other piezoelectric element plates 2, so that widthwise strain becomes smaller and the shearing stress received on the upper surface of the piezoelectric element plate 20 is reduced correspondingly.

Figure 6:
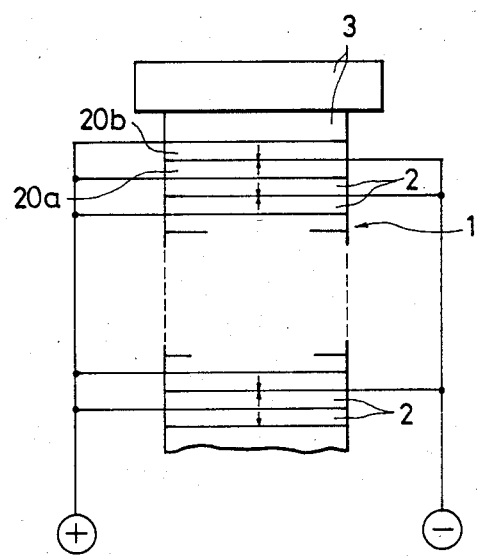
FIG. 6 is a side view of a fourth embodiment of a stacked type piezoelectric actuator according to the present invention.

FIG. 6 shows a fourth embodiment according to the present invention. In this embodiment, a first piezoelectric element plate 20a is made of a material having a piezoelectric strain constant $d_{33}$ smaller than for the other piezoelectric element plates 2 and is disposed at the second position from the upper end of an actuator 1. A second piezoelectric element plate 20b made of a material having a piezoelectric strain constant $d_{33}$ smaller than that of the first piezoelectric element plate 20a is disposed on the upper surface of the first piezoelectric element plate 20a. The piezoelectric element plates 2, 20a and 20b are stacked in such a manner that the direction of polarization of the piezoelectric element plates varies alternately one by one, and are connected in parallel to each other in the same manner as the third embodiment.

In such an arrangement as described above, the widthwise strain in the first piezoelectric element plate 20a is smaller than that in the respective piezoelectric element plate 2. The widthwise strain in the second piezoelectric element plate 20b is smaller than that in the first piezoelectric element plate 20a. Accordingly, the widthwise strain is gradually decreased toward the displacement deriving end of the actuator 1.

In the case where only a piezoelectric element plate 20 is arranged at the upper portion of the actuator 1 like the embodiment of FIG. 5, the shearing stress between the uppermost end surface of the actuator 1 and the lower surface of the no-strain portion 3 is reduced in comparison with the conventional case. The difference in strain between the lower surface of the plate 20 and the upper surface of the piezoelectric element plate 2 directly under the former is so large that it is more likely to generate wear in the electrode on the surface. In the fourth embodiment, however, the shearing stress between the piezoelectric element plate and the no-strain portion 3 can be easily reduced.

Thus, in the case where a plurality of piezoelectric element plates having piezoelectric strain constants $d_{33}$ stepwise different from one another are arranged at the end portion of the actuator such that the piezoelectric strain constant $d_{33}$ is lowest near the displacement deriving end portion, it is possible to more effectively attain the objects of the present invention.

Although the piezoelectric element plates 20, or 20a and 20b are provided at the upper portion of the actuator 1 in the third and fourth embodiments, the piezoelectric element plates 20, or 20a and 20b may be provided also at a lower portion of the actuator 1 so as to reduce shearing stress between a base portion acting as the no-strain portion 3 and the lowermost piezoelectric element plate of the actuator 1.

As described above, according to an aspect of the present invention, there are remarkable effects when the electrostrictive strain element 11 constituted by a plurality of piezoelectric element plates 10 stacked one on another is arranged at an end portion of the actuator 1 to reduce the shearing stress between the uppermost surface of the actuator 1 and the lower surface of the no-strain portion 3. In this way, the useful life of the actuator 1 can be prolonged. Moreover the electrostrictive strain element 11 is constituted by piezoelectric element plates 10 formed through the same process as the piezoelectric element plates 2 so that it is unnecessary to add new molding steps in order to manufacture the actuator 1. Accordingly, the actuator 1 while significantly improved can be manufactured with substantially the same cost as in the prior art cases.

Further, as described above, according to another aspect of the present invention, there are remarkable effects when the piezoelectric element plates 20, 20a and 20b having a piezoelectric strain constant $d_{33}$ smaller than that of the other piezoelectric element plates 2 are arranged at an end portion of the actuator 1 to reduce the shearing stress between the uppermost surface of the actuator 1 and the lower surface of the no-strain portion 3. The lifetime of the actuator 1 can be prolonged, and since the piezoelectric element plates 20, 20a and 20b can be formed by the same process as the piezoelectric element plates 2, it is unnecessary to add new molding steps in manufacturing the actuator 1. Accordingly, the actuator 1 can also be manufactured with about the same cost as in the prior art cases.

It should be understood that the present invention is not limited to the particular embodiments described, but rather is susceptible to modifications, alternations, and equivalent arrangements within the scope of the appended claims.

What is claimed is:

1. A stacked type piezoelectric actuator comprising: a stack of electrostrictive strain elements including an end electrostrictive strain element, each of said electrostrictive strain elements of said stack including a first piezoelectric element plate and a second piezoelectric element plate of substantially equal dimensions, one of said first piezoelectric plates and said second piezoelectric plates of said end electrostrictive strain element defining a stack end piezoelectric element plate having a surface forming an en surface of said stack;
means for applying electrical potential to each of said first piezoelectric element plates and said second piezoelectric element plates of said stack, each of said first piezoelectric element plates being polarized in a first direction of polarization and each of said second piezoelectric element plates being polarized in a second direction of polarization opposite to said first direction of polarization when electric potential is applied to said first and second piezoelectric element plates;
a coupling electrostrictive strain element provided on said end surface of said stack end piezoelectric element plate and comprising two piezoelectric element plates each dimensioned substantially equal to each of said first piezoelectric element plates and mounted one on top of the other, said coupling electrostrictive strain element having a surface forming an end surface of said coupling electrostrictive strain element; and
electrode means connected to said applying means for supplying an electrical potential to polarize said two piezoelectric element plates of said coupling electrostrictive strain element as a single unit in a direction of polarization opposite to the direction of polarization of said stack end piezoelectric element plate.

2. The stacked type piezoelectric actuator according to claim 1, wherein said coupling electrostrictive strain element comprises three of said piezoelectric element plates each dimensioned substantially equal to each of said first piezoelectric plates and mounted on top of each other, said three piezoelectric element plates being connected to said electrode means to receive an electrical potential to polarize said three piezoelectric element plates of said coupling electrostrictive strain element as a single unit in a direction of polarization opposite to the direction of polarization of said stack end piezoelectric plate.

3. The stacked type piezoelectric actuator according to claim 1, further including an intermediate coupling electrostrictive strain element mounted on said end surface of said coupling electrostrictive strain element, said intermediate coupling electrostrictive strain element comprising three of said piezoelectric element plates each dimensioned substantially equal to each of said first piezoelectric plates and mounted one on top of the other, the top of said three piezoelectric element plates having a surface forming an end surface of said intermediate coupling electrostrictive strain element, said three piezoelectric element plates being connected to said electrode means to receive an electrical potential to polarize said three piezoelectric element plates of said intermediate electrostrictive strain element as a single unit in a direction of polarization opposite to the direction of polarization of said two piezoelectric element plates of said coupling electrostrictive strain element.

4. The stacked type piezoelectric actuator according to claim 9, further including a no-strain element mounted on the top surface of the said end surface of said piezoelectric element plate of said intermediate coupling electrostrictive strain element.

5. A stacked type piezoelectric actuator comprising: a stack of electrostrictive strain elements including an end electrostrictive strain element, each of said electrostrictive strain elements of said stack including a first piezoelectric element plate and and second piezoelectric element plate of substantially equal dimensions, each of said first and second piezoelectric element plates having a substantially equal piezoelectric strain constant, one of said first piezoelectric element plates and said second piezoelectric element plates of said end electrostrictive strain element defining a stack end piezoelectric element plate having a surface forming an end surface of said stack;

means for applying electrical potential to each of said first piezoelectric element plates and said second piezoelectric element plates of said stack, each of said first piezoelectric element plates being polarized in a first direction of polarization and each of said second piezoelectric element plates being polarized in a second direction of polarization opposite to said first direction of polarization when electric potential is applied to said first and second piezoelectric element plates;

a coupling electrostrictive strain element provided on said end surface of said stack and comprising a third piezoelectric element plate dimensioned substantially equal to each of said first piezoelectric element plates and having a surface forming an end surface of said coupling electrostrictive strain element; and electrode means connected to said applying means for supplying an electrical potential to polarize said third piezoelectric element plate of said coupling electrostrictive strain element in a direction of polarization opposite to the direction of polarization of said stack end piezoelectric element plate, said third piezoelectric element plate of said coupling electrostrictive strain element having a piezoelectric strain constant smaller than the piezoelectric strain constant of each of said first piezoelectric element plates.

6. The stacked type piezoelectric actuator according to claim 5, further including an intermediate coupling electrostrictive strain element comprising a fourth piezoelectric element plate dimensioned substantially equal to each of said first piezoelectric element plates and mounted on said end surface of said coupling electrostrictive strain element, said fourth piezoelectric element plate of said intermediate coupling electrostrictive strain element having a direction of polarization opposite to the direction of polarization of the third piezoelectric element plate of the coupling electrostrictive strain element and having a piezoelectric strain constant smaller than the piezoelectric strain constant of the third piezoelectric element plate of the coupling electrostrictive strain element.

* * * * *

UNITED STATES PATENT AND TRADEMARK OFFICE
CERTIFICATE OF CORRECTION

PATENT NO. : 4,885,498
DATED : December 5, 1989
INVENTOR(S) : Naomasa Wakita

It is certified that error appears in the above-identified patent and that said Letters Patent is hereby corrected as shown below:

Claim 1, Col. 7, Line 65, change "en" to --end--.

Signed and Sealed this

Fourth Day of August, 1992

Attest:

DOUGLAS B. COMER

*Attesting Officer*    Acting Commissioner of Patents and Trademarks